(12) United States Patent
Shim et al.

(10) Patent No.: US 7,638,790 B2
(45) Date of Patent: Dec. 29, 2009

(54) RF NANOSWITCH

(75) Inventors: Dong-ha Shim, Seongnam-si (KR);
Kuang-woo Nam, Yongin-si (KR);
Seok-chul Yun, Yongin-si (KR); In-sang Song, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 471 days.

(21) Appl. No.: 11/252,590

(22) Filed: Oct. 19, 2005

(65) Prior Publication Data

US 2006/0139842 A1    Jun. 29, 2006

(30) Foreign Application Priority Data

Dec. 27, 2004    (KR) .................... 10-2004-0113065

(51) Int. Cl.
*H01L 29/06*    (2006.01)

(52) U.S. Cl. ............ 257/9; 257/109; 257/415; 257/E51.04; 977/708; 200/181; 333/262

(58) Field of Classification Search ............ 257/9
See application file for complete search history.

(56) References Cited

U.S. PATENT DOCUMENTS

| 2002/0175408 A1* | 11/2002 | Majumdar et al. | .......... 257/734 |
| 2005/0280436 A1* | 12/2005 | Bertin | ............ 326/30 |
| 2006/0091983 A1* | 5/2006 | Robert | ............ 335/78 |

* cited by examiner

*Primary Examiner*—Tu-Tu V Ho
(74) *Attorney, Agent, or Firm*—Sughrue Mion, PLLC

(57) ABSTRACT

An RF nanoswitch which can reduce a loss in RF signal. The RF nanoswitch includes a first electrode unit connected to one terminal of a driving power supply, a second electrode connected to the other terminal of the driving power supply, and a dielectric material selectively coming into contact with at least one of the first electrode unit and the second electrode, depending on whether or not power is applied from the driving power supply.

8 Claims, 4 Drawing Sheets

RF NANOSWITCH

CROSS-REFERENCE TO RELATED APPLICATIONS

This application claims the benefit under 35 U.S.C. § 119 (a) from Korean Patent Application No. 2004-113065 filed Dec. 27, 2004 in the Korean Intellectual Property Office, the disclosure of which is incorporated herein by reference.

BACKGROUND OF THE INVENTION

1. Field of the Invention

The present invention relates to an RF (Radio Frequency) nanoswitch allowing the passage of a high frequency signal.

2. Description of the Related Art

Recently, according to development of a MEMS (Micro Electro Mechanical Systems) technique, MEMS RF nanoswitches have been developed, and in addition, nanometer-sized RF nanoswitches are on the way of being developed.

FIG. 1 schematically shows a conventional nanometer-sized subminiature RF nanoswitch, wherein the RF nanoswitch comprises a driving power supply 10, a source 20 connected one terminal of the power supply 10, at least one conductive nanotube 30 supported to be capable of being electrically connected to the source 20, a gate 40 provided under the nanotube 30 and connected to the other terminal of the driving power supply 10 to generate an electrostatic attractive force in cooperation with the nanotube 30, and a drain 50 in contact with the nanotube deformed by the electrostatic attractive force.

The RF nanoswitch having the aforementioned features is operated as follows. At first, if a controller, not shown in the drawing, applies a power to the driving power supply 10, an electrostatic attractive force is produced between the gate 40 and the nanotube 30 and thus the nanotube 30 sinks as indicated by dotted lines in FIG. 1. In addition, the sinking nanotube 30 comes into contact with the drain 50, whereby the RF nanoswitch is turned ON. In the ON state of the RF nanoswitch, an RF signal is inputted through the source and transmitted to a desired place through the nanotube 30 and the drain 50. Whereas, if no power is applied to the driving power supply 10, the nanotube 30 and the drain 50 are electrically isolated from each other and an RF signal cannot be transmitted to the drain 50.

However, the RF nanoswitch having the above-mentioned feature generates electric resistance of several tens to several hundreds kΩ at a contact portion between the nanotube 30 and the drain 50. Due to such electric resistance, an RF signal cannot be transmitted to the drain even if the RF nanoswitch is in the ON state or an increased loss in RF signal is caused even if the RF signal is transmitted. Accordingly, it is substantially difficult to commercialize such an RF nanoswitch as shown in FIG. 1.

SUMMARY OF THE INVENTION

Accordingly, the present invention has been made to solve the above-mentioned problems, and an aspect of the present invention is to provide a nanometer-sized subminiature RF nanoswitch which can reduce a loss in RF signal.

In order to achieve the above-mentioned aspect, there is provided an RF nanoswitch comprising: a first electrode unit connected to one terminal of a driving power supply; a second electrode connected to the other terminal of the driving power supply; and a dielectric material selectively coming into contact with at least one of the first electrode unit and the second electrode, depending on whether or not power is applied from the driving power supply.

Here, the RF nanoswitch may further comprise a substrate, on which the first electrode unit and the second electrode are supported.

The first electrode unit may comprise a support member supported on the substrate, and at least one nanotube fixed to the support member and selectively coming into contact with the dielectric material by an electrostatic force generated between the second electrode and the nanotube.

According to an exemplary embodiment of the present invention, the dielectric material is fixed to the second electrode, and the support member consists of first and second ground lines provided either side of a surface of the substrate, the nanotube being fixed to the first and second ground lines at the opposite ends thereof.

According to another exemplary embodiment of the present invention, the dielectric material may be provided on the nanotube.

According to still another exemplary embodiment of the present invention, the support member comprises a first signal line, into which an RF signal is inputted, and a body electrically connected to the first signal line, the nanotube being fixed to the body at one end thereof, and the second electrode consists of a second signal line. In addition, the RF nanoswitch may further comprise first and second ground lines provided either side of a surface of the substrate with reference to the second electrode and the first signal line, so that the first and second ground lines can guide the RF signal.

BRIEF DESCRIPTION OF THE DRAWINGS

The above aspects and features of the present invention will be more apparent from the description for certain exemplary embodiments of the present invention taken with reference to the accompanying drawings, in which.

DETAILED DESCRIPTION OF ILLUSTRATIVE, NON-LIMITING, EMBODIMENTS OF THE INVENTION

Hereinbelow, RF nanoswitches according to exemplary embodiments of the present invention are described in detail with reference to accompanying drawings. The described exemplary embodiments are intended to assist the understanding of the invention, and are not intended to limit the scope of the invention in any way.

Figure 1:
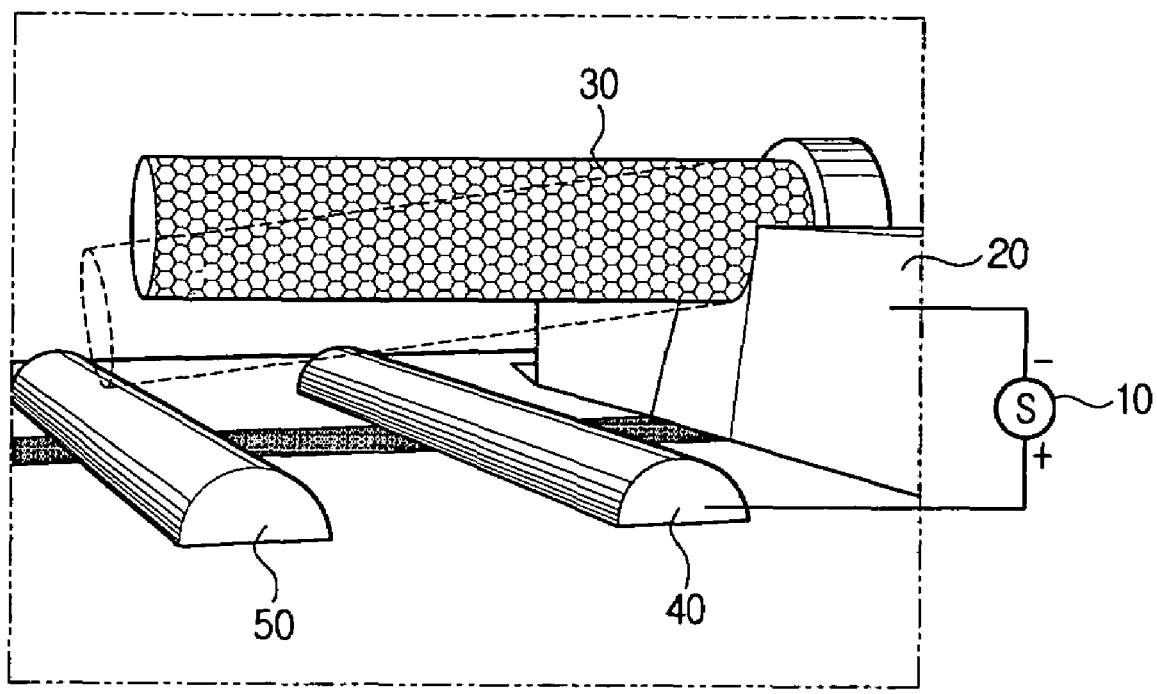
FIG. 1 is a perspective view schematically showing a conventional nanometer-sized RF nanoswitch.
Figure 2:
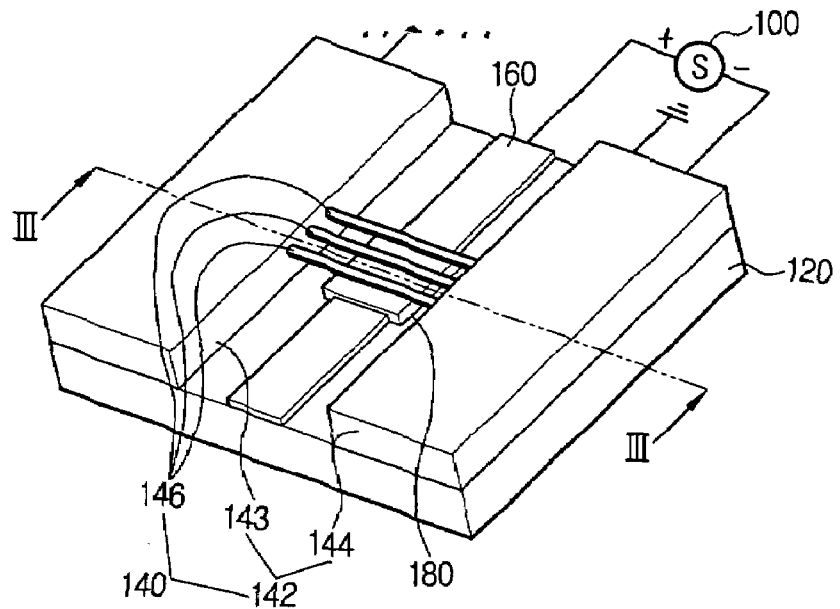
FIG. 2 is a perspective schematically showing an RF nanoswitch according to an exemplary embodiment of the present invention.
Figure 3A:
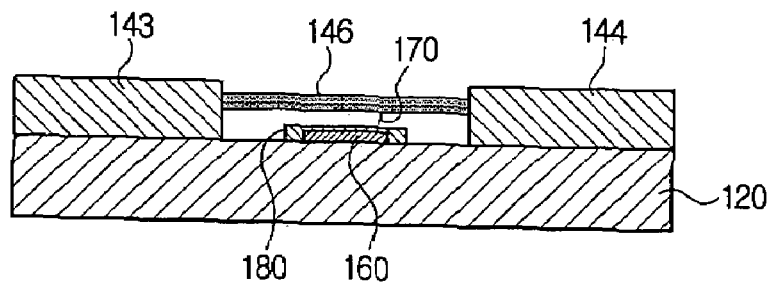
FIGS. 3A and 3B are cross-sectional views taken in the direction indicated by arrows III-III of FIG. 2 to describe the operation of the RF nanoswitch shown in FIG. 2.

Referring to FIGS. 2 and 3A, an RF nanoswitch according to an exemplary embodiment of the present invention is of shunt type and comprises a driving power supply 100, a substrate 120, a first electrode unit 140, a second electrode 160 and a dielectric material 180.

The driving power supply 100 is a DC power supply and applies a power to the first electrode unit 140 and the second electrode 160 to produce an electrostatic force. On each circuit for connecting the driving power supply 100, the first electrode unit 140 and the second electrode 160 with each other, an inductor (not shown) is connected, which has inductance sufficiently high to prevent the transmission of an RF signal to the driving power supply 100. As the impedance of each circuit connected to the driving power supply 100 is increased by the corresponding inductor, the RF signal cannot be transmitted to the driving power supply. Because the inclusion of such an inductor in a circuit is well known in the art, description thereof is omitted.

The substrate 120 is a frame for supporting the first electrode unit 140 and the second electrode 160 and can be formed from a wafer fabricated by cutting a mono-crystal silicon ingot.

The first electrode unit 140 comprises a set of nanotubes 146, and a support structure 142 which supports the nanotubes 146 and includes first and second ground lines 143, 144.

The nanotube set consists of three nanotubes 146 which are respectively supported by the first and second ground lines 143, 144 at opposite ends thereof. Such nanotubes 146 are formed by a horizontal or vertical growing method using a thermo-chemical deposition process so that the opposite ends thereof can be supported on the first and second ground lines 143, 144. The growing method of the nanotubes 146 is well known in the art and thus description thereof is omitted. Alternatively, the nanotubes 146 may be formed from a carbon nanotube or the like. Meanwhile, the number and material of the nanotubes 146 can be variously changed without being limited to those described above. In addition, the nanotubes can be formed through various nanotube growing methods.

The first and second ground lines 143, 144 are formed from a conductive material through a semiconductor deposition process on the either side of a surface of the substrate 120. The first and second ground lines 143, 144 are electrically earthed and each circuitally connected to one terminal of the driving power supply 100.

The second electrode 160 is formed from a conductive material on the substrate 120 through a semiconductor deposition process or the like to be interposed between the first and second ground lines 143, 144. The second electrode 160 also serves as a signal line for transmitting an RF signal (hereinbelow, the second electrode is also called as "signal line").

The dielectric material 180 is coated on the signal line 160 to be interposed between the nanotubes 146 and the signal line 160 through a semiconductor deposition process or the like. In addition, the raw material of the dielectric material 180 can be variously selected to obtain desired impedance to be described later.

Figure 3B:
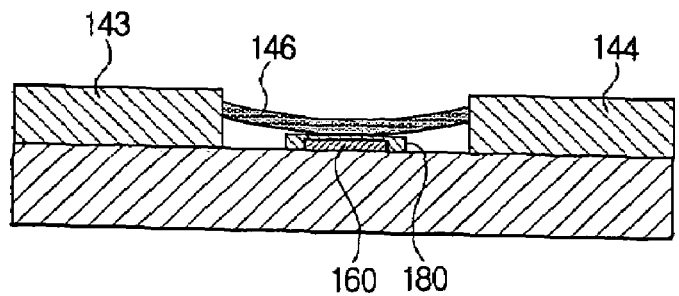

Now, description is made in terms of the operation of the RF nanoswitch of the present exemplary embodiment with reference to FIGS. 3A and 3B.

Referring to FIG. 3A, there is shown the RF nanoswitch in a state in which by the driving power supply 100 (see FIG. 2), no power is applied to the first and second ground lines 143, 144 included in the first electrode unit (see FIG. 2) and the signal line 160 which is the second electrode. Therefore, no electrostatic attractive force is produced between the nanotubes 146 and the signal line 160.

In addition, the impedance $Z_{ON}$ between the nanotubes 146 and the signal line 160 is calculated by Equation 1 as follows:

$$Z_{ON} = \left| \frac{1}{\omega C_{ON}} \right| \quad (1)$$

wherein $\omega$ indicates a frequency of an RF signal, $C_{ON}$ indicates capacitance determined by an air gap 170 and the dielectric material 180 interposed between the signal line 160 and the nanotubes 146. In addition, the impedance $Z_{ON}$ calculated according to Equation 1 is very high as compared to that of the signal line 160. Therefore, most of RF signals are transmitted through the signal line 160 and merely a minimum number of RF signals are transmitted through the first and second ground lines 143, 144. That is, the RF nanoswitch shown in FIG. 3A is in the ON state, so that an RF signal can be transmitted through the signal line 160 to a desired place.

Referring to FIG. 3B, there is shown the RF nanoswitch in a state in which power is applied to the first and second ground lines 143, 144 and the signal line 160, by the driving power supply 100 (see FIG. 2). Therefore, an electrostatic attractive force is produced between the nanotubes 146 and the signal line 160, wherein the nanotubes 146 are provided with the power through the first and second ground lines 143, 144. By this electrostatic attractive force, the nanotubes 146 are deformed to sink toward the signal line 160 side and consequently come into contact with the dielectric material 180 which is fixed to be in contact with the signal line 160. That is, the nanotubes 146 and the signal line 160 come into contact with each other with the dielectric material 180 being interposed between them. In the state of the RF nanoswitch in the state shown in FIG. 3B as described above, the impedance $Z_{OFF}$ between the nanotubes 146 and the signal line 160 may be calculated by Equation 2 as follows:

$$Z_{OFF} = \left| \frac{1}{\omega C_{OFF}} \right| \quad (2)$$

wherein $\omega$ indicates a frequency of an RF signal, $C_{OFF}$ indicates a capacitance determined by and the dielectric material 180 interposed between the signal line 160 and the nanotubes 146. In addition, the impedance $Z_{OFF}$ calculated according to Equation 2 is very low as compared to that of the signal line 160. Therefore, most of RF signals inputted into the signal line 160 are transmitted to the first and second ground lines through the nanotubes 146. In addition, the RF signals transmitted to the first and second ground lines 143, 144 are transmitted to the earthed parts and consequently disappear. That is, the RF nanoswitch shown in FIG. 3B is in the OFF state. Typically, in order for the RF nanoswitch to exhibit its function, the capacitance in the ON state, $C_{ON}$, shall be high in the extent of several hundred times of the capacitance in the OFF state, $C_{OFF}$, and such a ratio between $C_{ON}$ and $C_{OFF}$ can be tuned by changing the raw material of the dielectric material 180 so that the dielectric constant of the dielectric material 180 is changed.

Like this, by tuning the capacitance by means of a dielectric material, it is possible to reduce the impedance in an RF nanoswitch in which an increased loss in RF signal is caused due to contact resistance produced by a contact between an existing nanotube and a drain, whereby it will be possible to stably transmit an RF signal without any loss. In addition, by tuning the impedance by means of capacitance as mentioned above, it will be possible to commercialize a nanometer-sized subminiature RF nanoswitch.

Figure 4:
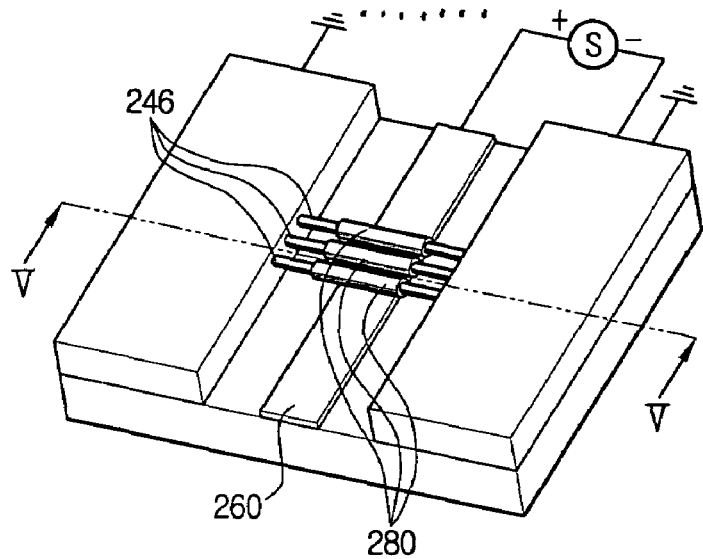
FIG. 4 is a perspective view schematically showing an RF nanoswitch according to another exemplary embodiment of the present invention.
Figure 5A:
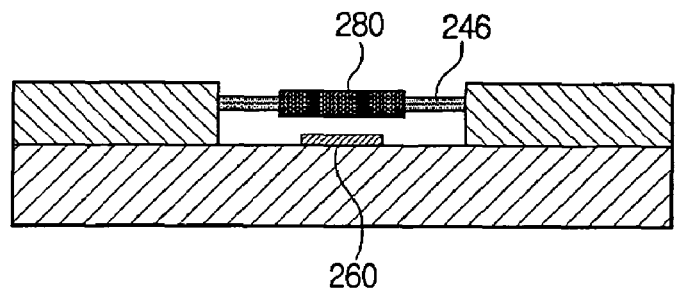
FIGS. 5A and 5B are cross-sectional views taken in the direction indicated by arrows V-V of FIG. 4.
Figure 5B:
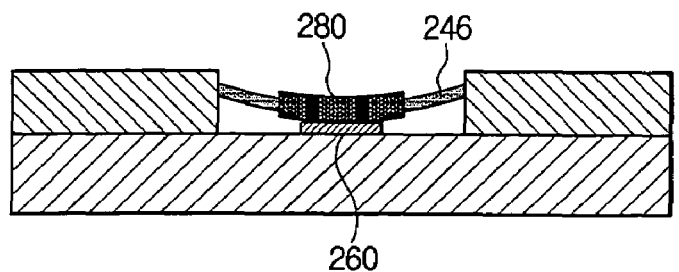

Referring to FIGS. 4 to 5B, an RF nanoswitch according to another exemplary embodiment of the present invention is different from the first exemplary embodiment described above in that a dielectric material 280 is coated on the outer periphery of the nanotubes 246. The nanotubes 246 coated with the dielectric material 280 are deformed by an electrostatic attractive force to sink toward the signal line 260 which is the second electrode 260. In addition, the other construction and operating principals of the RF nanoswitch according to the present exemplary embodiment are same with those of the above-mentioned exemplary embodiments and thus detailed description thereof is omitted.

Figure 6:
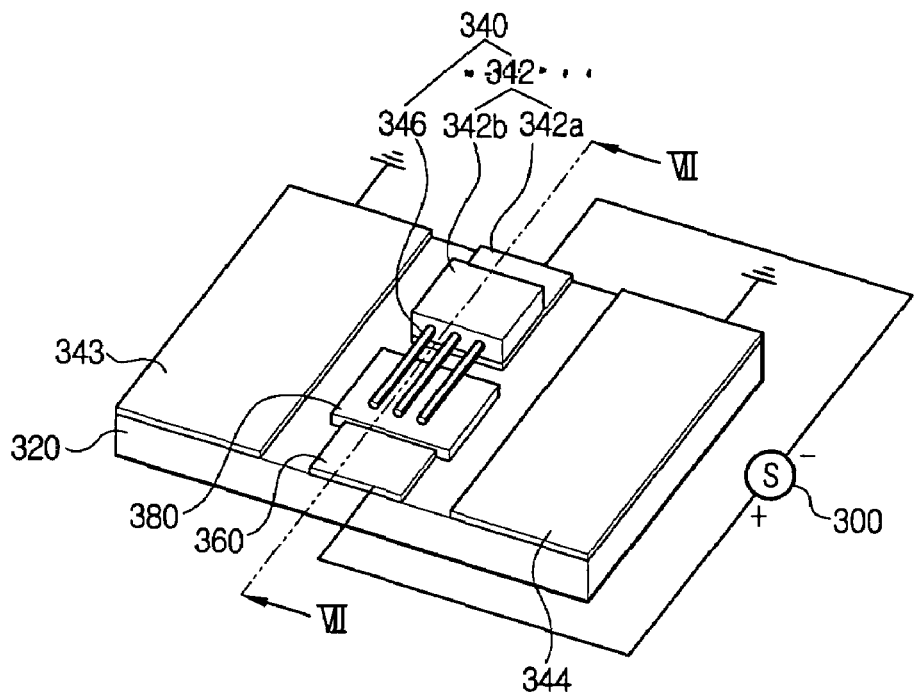
FIG. 6 is a perspective view schematically shows an RF nanoswitch according to another exemplary embodiment of the present invention.
Figure 7A:
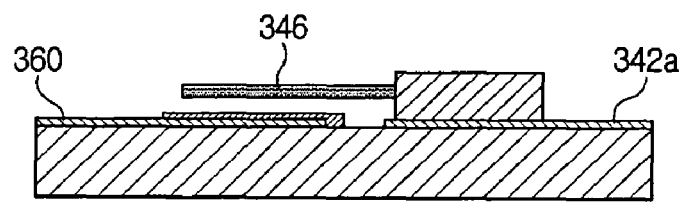
FIGS. 7A and 7B are cross-sectional views taken in the direction indicated by arrows VII-VII of FIG. 6.
Figure 7B:
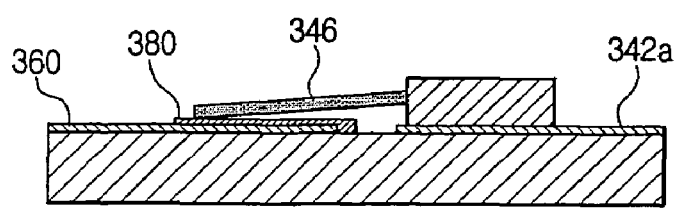

FIGS. 6 to 7B schematically show a series type RF nanoswitch, which is an RF nanoswitch according to a third exemplary embodiment of the present invention.

Referring to FIG. 6, the RF nanoswitch according to the third exemplary embodiment of the present invention comprises a driving power supply 300, a substrate 320, a first electrode unit 340, a second electrode, a dielectric material 380, and first and second ground lines 343, 344.

The driving power supply 300 and the substrate 320 are same with those of the first and second exemplary embodiments described above in construction and fabricating method and thus detailed description thereof is omitted.

The first electrode unit 340 comprises a support member 342 and plural nanotubes 346.

The support member 342 includes a first signal line 342a provided on the substrate 320 and a body 342b attached to a side of the first signal line 342a. The first signal line 342a is a terminal for inputting an RF signal, which is connected to an RF signal generator side. The first signal line 342a is connected to one terminal of the driving power supply 300. Alternatively, the one terminal of the driving power supply 300 may be connected to the body 342b. The body 342b and the first signal line 342a may be formed from a conductive material through a semiconductor deposition process.

The nanotubes 346 are fixed to the body 342b at one end thereof and the other ends are free ends. In addition, they may be formed from a conductive material, which may be same as that of the nanotubes, through a horizontal growing method using a thermal-chemical vapor deposition process or the like as described above.

The second electrode 360 is connected to the other terminal of the driving power supply 300 and also serves as a second signal line 360 (hereinbelow, the second electrode is also called as "second signal line") for transmitting an RF signal transferred through the first signal line 342a, the body 342b and the nanotubes 346. The second signal line 360 may be formed on the substrate 320 through a semiconductor deposition process, like the first signal line 342a.

The dielectric material 380 is formed on the second signal line in such a way that when the nanotubes 346 are deformed by an electrostatic attractive force to sink toward the second electrode 360 side, the nanotubes 346 are capable of coming into contact with the dielectric material 380. However, the dielectric material 380 may be also formed on the outer peripheral surfaces of the nanotubes 346 like the other exemplary embodiments of the present invention. Meanwhile, the dielectric material 380 may be also formed on the second signal line 360 using a semiconductor deposition process or the like.

The first and second ground lines 343, 344 are formed on either side of a surface of the substrate 32 to be electrically earthed, with the first and second lines 342a, 360 being positioned between the first and second signal lines 342a, 360. The first and second ground lines generates a electromagnetic field by cooperating with an RF signal intended to be transmitted, thereby guiding the RF signal to be capable of being transmitted to the first and signal lines. The principal for guiding the RF signal to the first and second ground lines 343, 344 are well-known in the art and thus detailed description thereof is omitted.

Now, the operation of the RF nanoswitch of the third exemplary embodiment of the present invention is described with reference to FIGS. 7A and 7B.

Referring to FIG. 7A, there is shown an RF nanoswitch in the state in which no power is applied from the driving power supply 300 (see FIG. 6). At this time, an RF signal inputted through the first signal line 342a has an impedance $Z_{ON}$ between the nanotubes 346 and the second signal line 360 as expressed by Equation 1 above, wherein the RF signal is not transmitted to the second signal line 360 because the impedance $Z_{ON}$ is too high. That is, the RF nanoswitch remains in the OFF state.

Referring to FIG. 7B, if power is applied to the first signal line 342a and the second signal line 36o from the driving power supply 300 (see FIG. 6), the free end sides of the nanotubes 346 are deformed to sink toward the second signal line 360 side by an electrostatic attractive force. Then, the deformed nanotubes 346 come into contact with the dielectric material 380. Like this, as the nanotubes 346 come into contact with the dielectric material 380, the impedance between the nanotubes 346 and the second signal line 360 turns to $Z_{OFF}$ as expressed by Equation 2. Because the impedance $Z_{OFF}$ is low in the extent of several hundredth times of $Z_{ON}$, and an RF signal inputted into the first signal line 342a is allowed to be transmitted to the second signal line 360. The ratio between $Z_{OFF}$ and $Z_{ON}$ can be tuned by selecting an appropriate material for the dielectric material as described above.

As described above, according to the present invention, it is possible to reduce impedance at a contact part so that a loss in RF signal can be reduced.

In addition, according to the exemplary embodiment of the present invention, it is also possible to realize a nanometer-sized subminiature RF nanoswitch which can reduce a loss in RF signal.

While the exemplary embodiments of the present invention have been shown and described in order to exemplify the principle of the present invention, the present invention is not limited to the specific exemplary embodiments. It will be understood that various modifications and changes can be made by one skilled in the art without departing from the spirit and scope of the invention as defined by the appended claims. Therefore, it shall be considered that such modifications, changes and equivalents thereof are all included within the scope of the present invention.

What is claimed is:

1. A radio frequency (RF) nanoswitch comprising:
a first electrode unit connected to one terminal of a driving power supply;
a second electrode connected to the other terminal of the driving power supply; and
a dielectric material fixed to a nanotube, the dielectric material selectively coming into contact with at least one of the first electrode unit and the second electrode, depending on whether or not power is applied from the driving power supply,
wherein the dielectric material is configured to allow a signal to transfer between the second electrode and the first electrode unit, via the nanotube, when the dielectric material is in contact with one of the first electrode unit and the second electrode.

2. The RF nanoswitch as claimed in claim 1, further comprising a substrate, on which the first electrode unit and the second electrode are supported.

3. The RF nanoswitch as claimed in claim 2, wherein the support member includes first and second ground lines provided either side of a surface of the substrate, the nanotube being fixed to the first and second ground lines at the opposite ends thereof.

4. A radio frequency (RF) nanoswitch comprising:
first and second ground lines connected one terminal of a driving power supply;
a signal line connected to another terminal of the driving power supply; and
at least one nanotube fixed to each of the first and second ground lines at the opposite ends thereof and provided with a dielectric material on an outer peripheral surface thereof, the nanotube being selectively deformed by an electrostatic force so that the dielectric material on the nanotube comes into contact with the signal line depending on whether or not power is applied from the driving power supply,
wherein the dielectric material is configured to allow a signal to transfer between the signal line and the nanotube when the dielectric material comes into contact with the signal line.

5. The RIP nanoswitch as claimed in claim 4, further comprising:
a substrate, on which the first and second ground lines and the signal line are supported.

6. The RF nanoswitch as claimed in claim 5, wherein the signal line is positioned between the first and second ground lines.

7. The RF nanoswitch as claimed in claim 6, wherein the nanotube is a carbon nanotube.

8. The RF nanoswitch as claimed in claim 4, wherein the dielectric material is fixedly formed on the outer peripheral surface of the nanotube.

* * * * *